(12) United States Patent
Takagi

(10) Patent No.: US 9,041,190 B2
(45) Date of Patent: *May 26, 2015

(54) SEMICONDUCTOR PACKAGE

(71) Applicant: Kabushiki Kaisha Toshiba, Minato-ku (JP)

(72) Inventor: Kazutaka Takagi, Kanagawa-ken (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/200,284

(22) Filed: Mar. 7, 2014

(65) Prior Publication Data

US 2014/0306329 A1    Oct. 16, 2014

(30) Foreign Application Priority Data

Apr. 15, 2013 (JP) ................................. 2013-085234

(51) Int. Cl.
| | |
|---|---|
| *H01L 23/12* | (2006.01) |
| *H01L 23/495* | (2006.01) |
| *H01L 23/10* | (2006.01) |
| *H01L 23/047* | (2006.01) |

(52) U.S. Cl.
CPC . *H01L 23/49582* (2013.01); *H01L 2224/48091* (2013.01); *H01L 2924/19107* (2013.01); *H01L 23/10* (2013.01); *H01L 23/047* (2013.01)

(58) Field of Classification Search
CPC .......... H01L 2224/49175; H01L 2224/48227; H01L 23/047; H01L 23/66; H01L 29/7786; H01L 29/812
USPC .................. 257/699, 700, 703, 704, E23.183
See application file for complete search history.

(56) References Cited

U.S. PATENT DOCUMENTS

| | | | |
|---|---|---|---|
| 2005/0167790 A1* | 8/2005 | Khor et al. ..................... | 257/666 |
| 2010/0212942 A1* | 8/2010 | Tuan et al. ..................... | 174/257 |
| 2011/0048757 A1* | 3/2011 | Yamamoto et al. .......... | 174/50.5 |

(Continued)

FOREIGN PATENT DOCUMENTS

| | | |
|---|---|---|
| JP | 2000-012755 | 1/2000 |
| JP | 2003-068916 | 3/2003 |

(Continued)

OTHER PUBLICATIONS

U.S. Appl. No. 14/202,075, filed Mar. 10, 2014, Takagi.

(Continued)

*Primary Examiner* — Khiem D Nguyen
(74) *Attorney, Agent, or Firm* — Oblon, McClelland, Maier & Neustadt, L.L.P.

(57) ABSTRACT

A semiconductor package, wherein, in bonding of members constituting the semiconductor package, by using bonding layers containing 98 wt % or more of one metallic element such as silver having a melting point of 400° C. or higher, the bonding is performed in a temperature range where the occurrence of warpage or distortion of the members is suppressed, and after the bonding, a high melting point is obtained; and by configuring the members so that all the surfaces of the members which become bonding surfaces of bonding layers are parallel to each other, all the thickness directions of the bonding layers are aligned to be in the same direction, and during the formation of the bonding layers, the pressing direction is set to be one-way direction which is the direction of laminating the members.

4 Claims, 5 Drawing Sheets

(56) References Cited

U.S. PATENT DOCUMENTS

| | | |
|---|---|---|
| 2012/0126246 A1 | 5/2012 | Takagi |
| 2013/0105205 A1 | 5/2013 | Takagi |
| 2014/0063757 A1 | 3/2014 | Takagi |

FOREIGN PATENT DOCUMENTS

| | | |
|---|---|---|
| JP | 2006-13241 | 1/2006 |
| JP | 2008-028364 | 2/2008 |
| JP | 2011-46770 | 3/2011 |
| JP | 2011-071301 | 4/2011 |
| JP | 2011-165745 | 8/2011 |
| JP | 2012-124477 A | 6/2012 |
| JP | 2012-209334 | 10/2012 |
| JP | 2013-77741 | 4/2013 |
| JP | 2013-187303 A | 9/2013 |
| JP | 2013-187418 A | 9/2013 |
| JP | 2013-229474 A | 11/2013 |
| JP | 2014-049700 A | 3/2014 |
| JP | 2014-053384 A | 3/2014 |
| KR | 10-2011-0003499 | 1/2011 |

OTHER PUBLICATIONS

U.S. Appl. No. 13/871,149, filed Apr. 26, 2013, Kazutaka Takagi.

Korean Office Action with English translation dated Mar. 18, 2015 in Korean patent application No. 10-2014-0017714, citing documents AO, AP, and AQ therein (18 pages).

Japanese Office Action with English translation dated Mar. 19, 2015 in Japanese patent application No. 2013-085234, citing documents AR, AS, and AT therein (7 pages).

* cited by examiner

SEMICONDUCTOR PACKAGE

CROSS-REFERENCE TO RELATED APPLICATIONS

This application is based upon and claims the benefit of priority from the prior Japanese Patent Application No. 2013-085234, filed on Apr. 15, 2013, the entire contents of which are incorporated herein by reference.

FIELD

Embodiments described herein relate generally to a semiconductor package containing semiconductor devices.

BACKGROUND

In many case, semiconductor devices including semiconductor elements, peripheral circuits, are used in the form of, for example, a semiconductor package containing and hermetically sealing the semiconductor devices by taking into consideration mounting, heat dissipation, and the like. When the semiconductor devices are to be contained in the semiconductor package, the semiconductor devices are fixed on a substrate of the semiconductor package through bonding or the like.

Therefore, in this type of the semiconductor package, in terms of the bonding temperature of the semiconductor device or the operating temperature of the semiconductor device, the structure needs to be sufficiently stabilized, and thus, when the semiconductor package is to be assembled, members are bonded to each other by using silver solder or the like having a high melting point (for example, 780° C. or higher). Namely, the members are bonded to each other at a temperature which is much higher than the bonding temperature of the semiconductor device or the operating temperature of the semiconductor device.

However, in the case of using silver solder or the like, since the assembling is performed at a high temperature, warpage or distortion may occur due to a difference in coefficients of thermal expansion among the members made of different materials, and thus, a function as a semiconductor package may be deteriorated.

DETAILED DESCRIPTION

Figure 1:
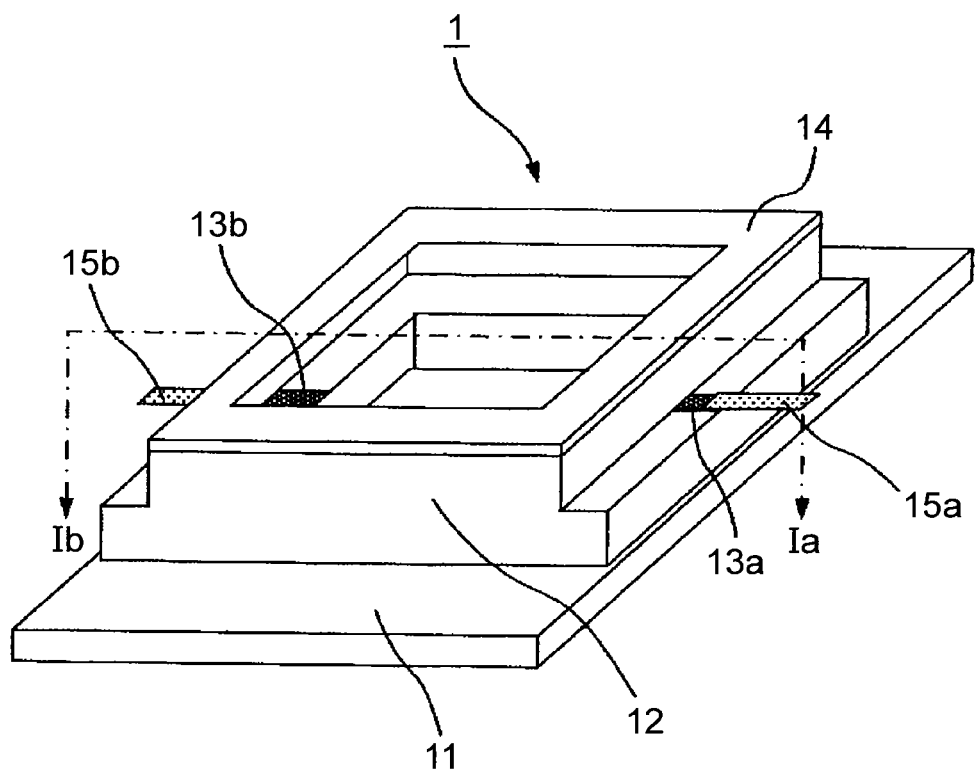
FIG. 1 is a perspective view illustrating an outer appearance of a semiconductor package according to an embodiment of the present invention.

Therefore, the inventors of the present application proposed a technique for solving the problem in Japanese Patent Application Number 2012-193605 (U.S. application Ser. No. 13/871,149; the entire contents of which are incorporated herein by reference). The technique disclosed in JP 2012-193605 has excellent points in that members in a semiconductor package can be bonded to each other through a bonding process at a temperature (for example, about 300° C. to 400° C.) lower than the temperature of sliver soldering, and moreover, after the bonding, a bonding layer having a melting point higher than that of silver soldering can be formed.

During the bonding process, it is necessary to press the members interposing bonding layers so as to form a stabilized bonding layer. When the package has different directions of the bonding surface, the different directions of pressing is necessary. However, it is difficult to press the members in a plurality of different directions, and it makes the bonding process complicated. Therefore, it is necessary to form all the bonding layers to bond the members by pressing the members in the same direction (in one direction). In addition, at this time, all the thickness directions of the bonding layers are formed to be the same direction (pressing direction).

In this manner, a semiconductor package is preferred to have a form and structure where all the bonding layers are formed by pressing members in one direction when the members of the semiconductor package are bonded to each other.

In view of the above circumstances, an embodiment of the present invention is to provide a semiconductor package having small warpage or distortion and maintaining good hermeticity by forming a stabilized bonding layer without complicating manufacturing processes.

According to an aspect of the embodiment, there is provided a semiconductor package including: a flat substrate having a fixation area where a semiconductor device is fixed on an upper surface; a ceramic frame body having a planar shape including upper-layer and lower-layer ceramic frames, a printed wiring which becomes a terminal being formed on an upper surface of the lower-layer ceramic frame, portions of the upper-layer ceramic frame where there are the printed wiring being narrower than the lower-layer ceramic frame in width so that the both ends of the printed wiring are exposed to be used as terminals, the ceramic frame body surrounds the fixation area and is laminated on an upper surface of the substrate, and the bottom surface of the ceramic frame body being bonded to the upper surface of the substrate through a first bonding layer; a metal ring which has a shape corresponding to a shape of the frame in the upper surface of the ceramic frame body and which is laminated on the upper surface of the ceramic frame body to be bonded to the ceramic frame body through a second bonding layer; and a lead which is laminated on the printed wiring to be bonded to the printed wiring through a third bonding layer, wherein each of the first bonding layer, the second bonding layer, and the third bonding layer contains 98 wt % or more of at least one metallic element having a melting point of 400° C. or higher.

Hereinafter, the semiconductor package according to the embodiment will be described with reference to FIGS. 1 to 5.

Figure 2:
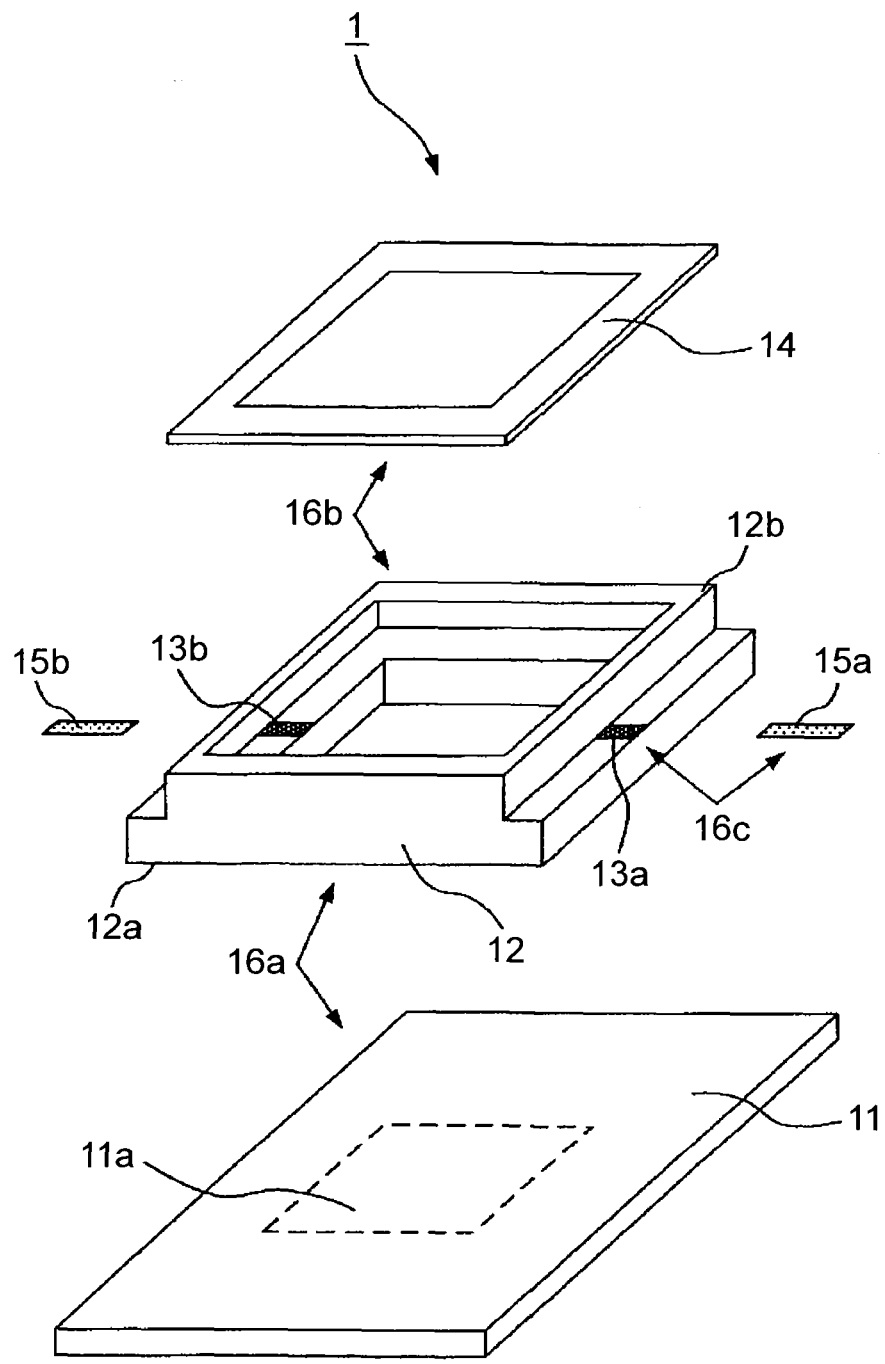
FIG. 2 is an exploded perspective view illustrating the semiconductor package illustrated in FIG. 1.
Figure 3:
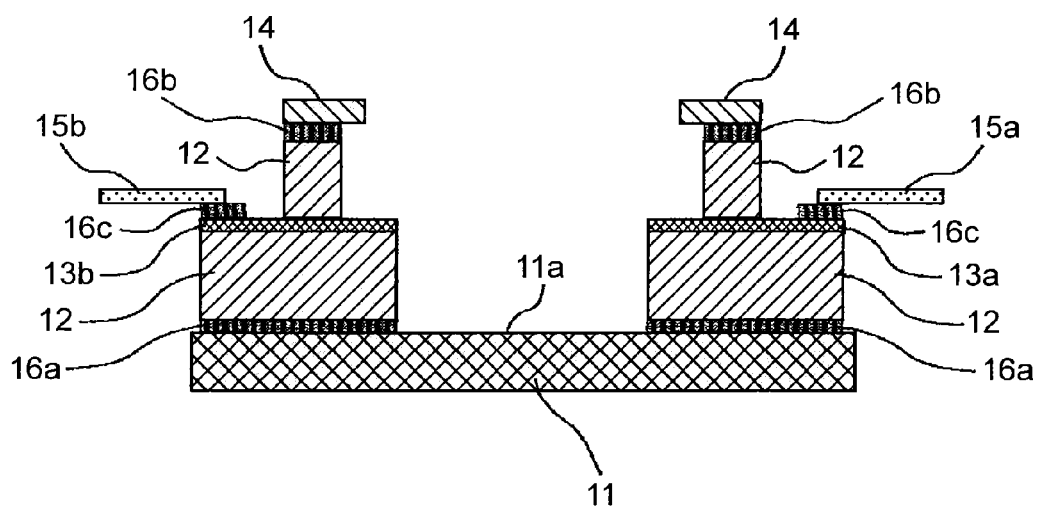
FIG. 3 is a cross-sectional view illustrating a model of a cross section of the semiconductor package taken along line Ia-Ib of FIG. 1.

FIG. 1 is a perspective view illustrating an outer appearance of the semiconductor package according to the embodiment, and FIG. 2 is an exploded perspective view thereof. In addition, FIG. 3 is a cross-sectional view illustrating a model of a cross section taken along line Ia-Ib of FIG. 1. As illustrated in the figure, the semiconductor package 1 is configured to include a substrate 11, a ceramic frame body 12 where printed wirings 13 are formed, a metal ring 14, and leads 15 which are bonded to the printed wirings 13.

The substrate 11 and the ceramic frame body 12 are bonded to each other by a bonding layer 16a (first bonding layer); the ceramic frame body 12 and the metal ring 14 are bonded to each other by a bonding layer 16b (second bonding layer); and the printed wirings 13 and the leads 15 are bonded to each other by a bonding layer 16c (third bonding layer), so that these are integrated as a semiconductor package. In addition, the bonding layers 16 (16a, 16b, and 16c) are formed so that thickness directions are the same direction. In the embodiment, as illustrated in FIG. 3, all the thickness directions of the bonding layers are formed to be the up/down direction of the paper, that is, the direction in which members are laminated.

The substrate 11 is formed in a shape of a flat plate made of, for example, copper (Cu), a compound of copper (Cu) and molybdenum (Mo), laminate of copper (Cu) and molybdenum (Mo), and the like, and the upper surface thereof includes a fixation area 11a where the semiconductor devices and the like are fixed. The ceramic frame body 12 has a shape of a quadrangular frame surrounding the fixation area 11a, and a bottom surface 12a and an upper surface 12b are parallel to each other. In addition, the ceramic frame body 12 is laminated on the substrate 11 so as to surround the fixation area 11a and is bonded to the substrate 11 through the bonding layer 16a by using a contact surface between the bottom surface 12a and the substrate 11 as a bonding surface.

In addition, two printed wirings 13 (13a and 13b) are formed on sidewalls of the ceramic frame body 12 to penetrate the frame body. The printed wirings 13 are formed on the surface parallel to the bottom surface 12a and the upper opening surface 12b which are parallel surfaces and are formed so that the front surfaces thereof at the upper surface 12b side are exposed. In the embodiment, the opposite sidewalls of the ceramic frame body 12 are formed in a shape of a stairs, and the printed wirings 13 on a surfaces of the stairs are exposed.

Figure 4:
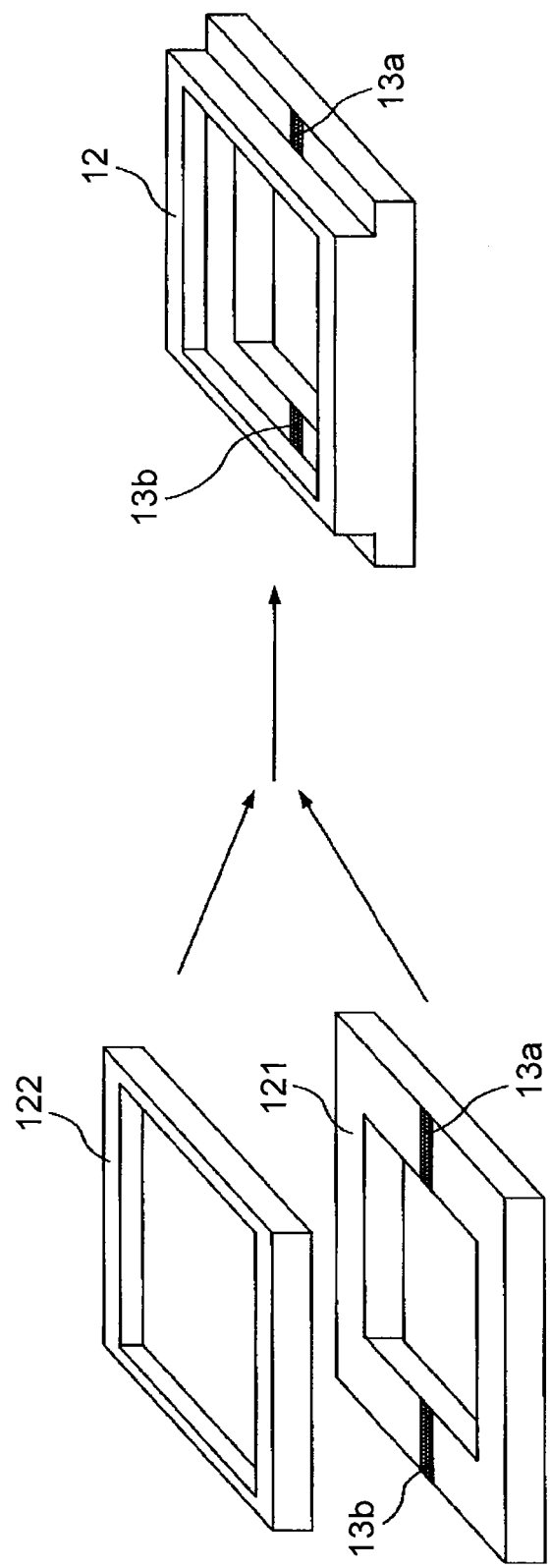
FIG. 4 is an exploded perspective view illustrating an example of a structure of a ceramic frame of the semiconductor package illustrated in FIG. 1.

An example of a method of forming the ceramic frame body 12 having the shape is illustrated in FIG. 4. In the example illustrated in FIG. 4, first, a lower frame 121 and an upper frame 122 are formed as the two lower and upper frames having parallel surfaces by using a ceramic material. The lower frame 121 is formed in a wide shape so that the upper surface of the lower frame 121 is exposed as a stairs surface when the two frames overlap each other. After the two printed wirings 13a and 13b are formed between inner and outer edges on the upper surface of the lower frame 121, the upper frame 122 overlaps the lower frame 121, and the resulting product is integrated through baking, so that the ceramic frame body 12 according to the embodiment can be obtained.

The metal ring 14 has a shape corresponding to the shape of the frame of the upper surface 12b side of the ceramic frame body 12 and is formed by using, for example, a Kovar material or the like as an alloy formed by mixing nickel (Ni) and cobalt (Co) with iron (Fe). The metal ring 14 is laminated on the upper surface 12b of the ceramic frame body 12 and is bonded to the ceramic frame body 12 through the bonding layer 16b. Since the metal ring 14 absorbs unevenness or waviness of the surface of the upper surface 12b of the ceramic frame body 12, for example, when laminating a cap (not illustrated) or the like and performing sealing after allowing the semiconductor devices and the like to be accommodated in the semiconductor package 1, the metal ring 14 maintains good hermeticity of the cap and the like.

The two leads 15 (15a and 15b) are bonded to the surfaces of the portions of the two printed wirings 13a and 13b, which are exposed outside from the ceramic frame body 12, through the bonding layer 16c. The leads 15 are formed as terminals for connecting signals to the semiconductor devices and the like contained in the semiconductor package 1 through the printed wirings 13 by using, for example, copper or a Kovar material.

All the three bonding layers 16 (16a, 16b, and 16c) include 98 wt % or more of one metallic element having a melting point of 400° C. or higher. In the embodiment, the bonding layers 16 are formed by using silver (Ag) as a metallic element through a method disclosed in, for example, Japanese Patent Application Number 2012-193605. Namely, if the metallic elements are formed as fine particles having a small diameter so-called nanoparticles, the melting point thereof can be reduced by several 100° C. in comparison with the case of a bulk metal, and thus, for the bonding, the bonding layers are formed while reducing the melting point of the metallic element by using the nanoparticles, and after the formation of the bonding layers, as bonding layers of a bulk metal integrated by the nanoparticles, the bonding layers have the melting point of the bulk metal.

In the case of using silver as a metallic element, the melting point of the bulk silver is about 960° C. On the contrary, since the melting point of silver nanoparticles having a diameter of several 10 nm is decreased down to a range of 150° C. to 300° C., the bonding layers can be formed in a temperature range of about 300° C. to 400° C. For this reason, when the members are integrated as a package, the occurrence of warpage or distortion can be suppressed. Moreover, since the melting point of the bonding layer formed is, for example, about 960° C. which is the melting point of bulk silver, the structure is also sufficiently stabilized in terms of the bonding temperature or operating temperature of the semiconductor device.

In the formation of each bonding layer 16, for example, a paste of a bonding material (not illustrated) containing the above-described silver nanoparticles in an organic solvent is applied on the bonding surfaces of the members of the bonding objects, and after that, the bonding surfaces are in contact with each other so as to laminate each other, and the resulting product is pressed while maintaining a temperature range of 300° C. to 400° C. By maintaining this state for a predetermined time, the silver nanoparticles are sintered, so that desired bonding layers are formed.

In addition, with respect to the relation between the composition of the metal of the bonding layer and the melting point thereof, in the case of silver according to the embodiment, for example, since the melting point of the silver solder containing 28 wt % of copper is about 780° C., the melting point can be increased to be higher than the melting point of silver solder by allowing 90 wt % or more of silver to be contained. Besides the silver according to the embodiment, gold (Au), copper (Cu), and nickel (Ni) can be employed as a metallic element used for the bonding layers, and the same method as the above-described method may be employed to form the bonding layers. However, for example, in the case of employing gold, the melting point of the gold is decreased to be much lower than the melting point (about 1064° C.) of bulk gold by mixing the gold with other elements. For this reason, in the case of employing any metal, it is preferable that the bonding layer be allowed to contain 98 wt % of one metallic element so as to maintain a high melting point of the bonding layer.

As described above, the bonding material is a paste where Ag nanoparticles are dispersed in, for example, an organic solvent. The diameter of Ag nanoparticles is, for example, in a range of 10 nm to 100 nm. In addition, the Ag nanoparticle may have a protective film on its surface. As an organic solvent, for example, telpene alcohol is used. The bonding material can be applied by using, for example, a dispenser or a printing method.

Next, heating is performed in the close-contact or contacting state where weight is exerted while maintaining a temperature range of 300° C. to 400° C. Therefore, the organic solvent of the bonding material is allowed to be evaporated, so that the Ag nanoparticles remain. Further, a bonding portion containing the bulk Ag is formed by sintering the Ag nanoparticles.

The melting point of the bulk Ag is about 960° C. On the contrary, the melting point of the Ag nanoparticles having a diameter of several 10 nm is decreased down to a range of 150° C. to 300° C. Namely, the bonding portion containing the bulk Ag can be formed by maintaining the bonding material containing the Ag nanoparticles in a temperature range of 300° C. to 400° C. The bonding is stabilized in a temperature of 900° C. or higher. In addition, in the package bonded at a low temperature of 300° C. to 400° C., the occurrence of warpage or distortion between the substrate and the frame is suppressed.

For example, the melting point of the silver solder (AgCu) containing 28 wt % of copper (Cu) is 780° C. Therefore, the melting point can be increased to be higher than the melting point of the silver solder by allowing the concentration of Ag contained in the bonding portion to be, for example, 90 wt % or more. Namely, a more stabilized package can be achieved than a package of which members are bonded by using silver solder in terms of a bonding temperature or an operating temperature of electronic device.

On the other hand, in the case of employing Au as a metallic element, the melting point of bulk Au is 1064° C. On the contrary, the melting point of the Au nanoparticles having a diameter of 10 nm to 100 nm is in a range of 50° C. to 500° C. Au nanoparticles having a diameter of 10 nm to 100 nm may be employed. The Au particles having the aforementioned size can be sintered, for example, at a temperature of about 150° C. However, the melting point of an alloy obtained by mixing Au with other elements is decreased to be much lower than the melting point of the bulk Au. For example, the melting point of AuSi obtained by mixing Au with 6 wt % of silicon (Si) is 370° C. In addition, the melting point of AuGe obtained by mixing Au with 12 wt % of germanium (Ge) is 356° C. Therefore, in the case of employing the Au nanoparticles, it is preferable that the bonding portion be allowed to contain, for example, 98 wt % or more of Au.

In the case of employing Cu nanoparticles, the diameter thereof is preferably in a range of 10 nm to 100 nm. Whereas the melting point of bulk Cu is 1080° C., the melting point of the Cu nanoparticles having the aforementioned size is in a range of 300° C. to 400° C.

In the case of employing Ni nanoparticles, if the diameter thereof is 100 nm, the Ni nanoparticles can be sintered at a temperature of about 750° C. The melting point of bulk Ni is 1450° C., and by configuring with fine particles, the sintering temperature can be greatly decreased. For example, the Ni nanoparticles can be configured to have a diameter of several 10 nm, preferably, 10 nm or smaller, so that the sintering temperature can be further decreased.

In the semiconductor package 1 having the above-described configuration, the members including the substrate 11, the ceramic frame body 12 on which the printed wirings 13 are formed, the metal ring 14, and the leads 15 are bonded to the bonding layers 16 having the above-described composition to be integrated as the semiconductor package 1. In the embodiment, in the formation of the bonding layers between the members, silver is used as a metallic element of the bonding material, and the sequentially-laminated members are pressed while maintaining a predetermined temperature range.

Herein, in a related art, a semiconductor package or the like may have a configuration in which a feedthrough portion having, for example, a quadrangular outer shape for connecting signals is formed on a substrate, and a notch having a shape corresponding to the outer shape of the feedthrough portion is formed at a sidewall of a frame to penetrate the package. In this case, the bonding surfaces for bonding the sidewalls of the frame on the substrate to the quadrangular feedthrough portion exist on four peripheral surfaces facing to frame (upper, lower, and two side surfaces) of the feedthrough portion. Therefore, since the thickness directions of the bonding layers for bonding the upper and lower surfaces and the bonding layers for the two side surfaces are perpendicular to each other, in order to form bonding layers, pressing from different directions is required.

On the contrary, in the embodiment, when the members are laminated so as to be integrated as the semiconductor package, since the members are configured so that the corresponding surfaces of the members which become the bonding surface of the three bonding layers 16 are parallel to each other, all the thickness directions of the three bonding layers 16 (16a, 16b, and 16c) become the same direction, and thus, there is no bonding layer having different thickness direction. For this reason, the pressing direction for forming the bonding layers 16 may be the direction of laminating the members, that is, the one-way direction corresponding to the direction from the top to the bottom on the paper in the cross-sectional view of FIG. 3. Therefore, the three bonding layers 16 for bonding the members are able to be formed by pressing in the same direction (the direction for laminating the members).

In addition, since each bonding layer can be formed in a temperature range of, for example, about 300° C. to 400° C., warpage, distortion, or the like does not easily occur in each member and the semiconductor package; and since the bonding layers are formed to have a melting point of, for example, 900° C. or higher, the structure is sufficiently stabilized in terms of the temperature of fixing the semiconductor device or the like inside the semiconductor package and the operating temperature of the semiconductor device or the like.

As described above, in the embodiment, when the members are to be bonded to each other to be integrated as a semiconductor package, the members are bonded to each other by using the bonding layers containing 98 wt % or more of silver as one metallic element. Although the heating and pressing are needed during formation of the bonding layers, since the heating temperature can be set to be in a range of, for example, about 300° C. to 400° C., it is possible to reduce the occurrence of the warpage, distortion, or the like in the members and the semiconductor package. In addition, with respect to the pressing direction, since the bonding surfaces of the members are configured so that all the thickness directions of the bonding layers become the same direction, it is possible to form any one of the bonding layers by pressing in the direction of laminating the members, and it is possible to bond the members through the stabilized boning layers without complicating the manufacturing processes. Furthermore, since the bonding layers containing 98 wt % or more of silver have a high melting point of, for example, about 900° C., the stabilized structure can be maintained in terms of the heating temperature of fixing the semiconductor device or the like inside the package and the increase in temperature due to the heat released from the semiconductor device or the like during the operation.

Therefore, it is possible to obtain a semiconductor package having small warpage or distortion and having good hermeticity by forming stabilized bonding layers between members without complicating manufacturing processes.

Figure 5:
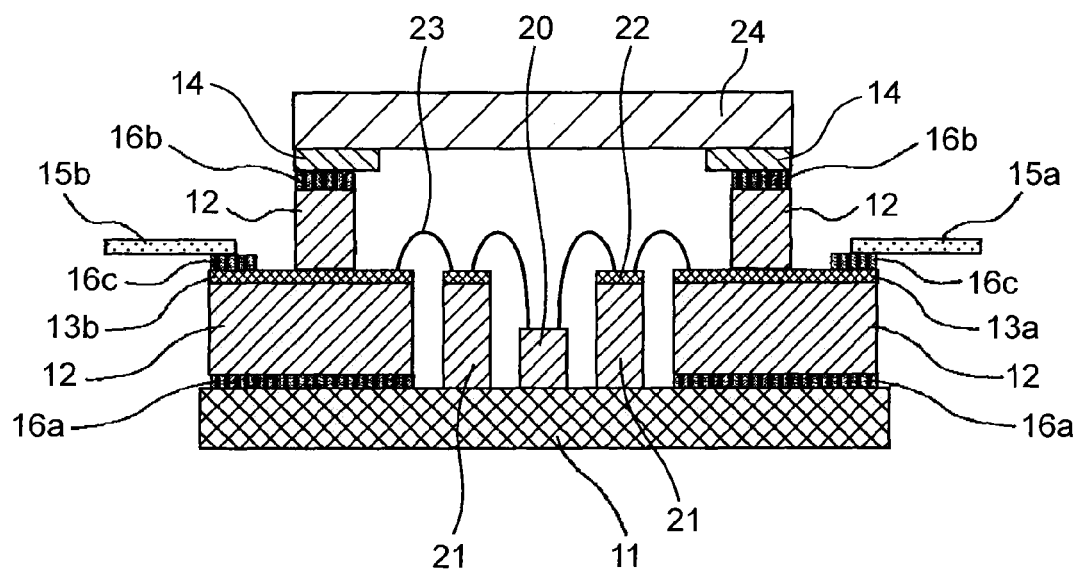
FIG. 5 is a schematic diagram illustrating an example of semiconductor device packaging according to the embodiment illustrated in FIG. 1.

FIG. 5 is a schematic diagram illustrating an example of semiconductor device packaging according to the embodiment. An electronic device 20 (semiconductor device) and a circuit board 21 are mounted on a device mounting portion (fixation area) of the semiconductor package. Conductive patterns 22 are formed on a surface of the circuit board 21 to electrically connect electrodes of the electronic device 20 with the printed wirings 13 (13a and 13b) through wire lines 23. In addition, a cover 24 is fixed on the frame 12.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor package comprising:
   a flat substrate having a fixation area where a semiconductor device is fixed on an upper surface;
   a ceramic frame body having a planar shape including upper-layer and lower-layer ceramic frames, a printed wiring being formed on an upper surface of the lower-layer ceramic frame, portions of the upper-layer ceramic frame corresponding to two ends of the printed wiring being narrower than the lower-layer ceramic frame in width so that the both ends of the printed wiring are exposed to be used as terminals, the ceramic frame body surrounds the fixation area and is laminated on an upper surface of the substrate, and the bottom surface of the ceramic frame body being bonded to the upper surface of the substrate through a first bonding layer;
   a metal ring which has a shape corresponding to a shape of the frame in the upper surface of the upper-layer ceramic frame, and the metal ring is laminated on the upper surface of the upper-layer ceramic frame to be bonded to the upper-layer ceramic frame through a second bonding layer; and
   a lead which is laminated on the printed wiring to be bonded to the printed wiring through a third bonding layer,
   wherein each of the first bonding layer, the second bonding layer, and the third bonding layer contains 98 wt % or more of at least one metallic element of bonding layers having a melting point of 400° C. or higher and is formed by nanoparticles of the metal element.

2. The semiconductor package according to claim 1, wherein the metallic element of bonding layers is any one of gold (Au), silver (Ag), copper (Cu), and nickel (Ni).

3. The semiconductor package according to claim 1, wherein the substrate is made of copper or a copper alloy, the metal ring is made of an alloy formed by mixing iron (Fe) with nickel (Ni) and cobalt (Co), and the lead is made of an alloy formed by mixing copper or iron (Fe) with nickel (Ni) and cobalt (Co).

4. The semiconductor package according to claim 1, wherein a side surface of the ceramic frame body has an outer shape of a stairs, and the printed wiring is formed to be exposed to a surface of the stairs.

* * * * *